(12) United States Patent
Dussaigne et al.

(10) Patent No.: US 10,886,429 B2
(45) Date of Patent: Jan. 5, 2021

(54) METHOD OF MANUFACTURING AN OPTOELECTRONIC DEVICE BY TRANSFERRING A CONVERSION STRUCTURE ONTO AN EMISSION STRUCTURE

(71) Applicants: Commissariat a l'energie atomique et aux energies alternatives, Paris (FR); THALES, Courbevoie (FR)

(72) Inventors: Amelie Dussaigne, Saint Hilaire de la Cote (FR); Ivan-Christophe Robin, Grenoble (FR)

(73) Assignees: Commissariat a l'energie atomique et aux energies alternatives, Paris (FR); THALES, Courbevoie (FR)

( * ) Notice: Subject to any disclaimer, the term of this patent is extended or adjusted under 35 U.S.C. 154(b) by 197 days.

(21) Appl. No.: 16/223,806

(22) Filed: Dec. 18, 2018

(65) Prior Publication Data
US 2019/0189835 A1    Jun. 20, 2019

(30) Foreign Application Priority Data

Dec. 19, 2017 (FR) ..................... 17 62422

(51) Int. Cl.
*H01L 33/00* (2010.01)
*H01L 33/06* (2010.01)
(Continued)

(52) U.S. Cl.
CPC ........ *H01L 33/0075* (2013.01); *H01L 33/007* (2013.01); *H01L 33/0025* (2013.01);
(Continued)

(58) Field of Classification Search
None
See application file for complete search history.

(56) References Cited

U.S. PATENT DOCUMENTS 6,576,933 B2 * 6/2003 Sugawara ............... H01L 33/32
257/103
6,815,725 B2 * 11/2004 Sugawara ........... H01L 33/0093
257/89
(Continued)

FOREIGN PATENT DOCUMENTS

EP    1 132 977 A2    9/2001
FR    3 019 380 A1    10/2015

OTHER PUBLICATIONS

Extended European Search Report dated Apr. 30, 2019 in European Patent Application No. 18213127.6 (with English translation of Category of Cited Documents), 7 pages.
(Continued)

*Primary Examiner* — David E Graybill
(74) *Attorney, Agent, or Firm* — Oblon, McClelland, Maier & Neustadt, L.L.P.

(57) ABSTRACT

The invention relates to a method of manufacturing an optoelectronic device (1) produced on the basis of GaN, comprising an emission structure (10) configured to emit a first light radiation at the first wavelength ($\lambda_1$),
the method comprising the following steps:
i. producing a growth structure (20) comprising a nucleation layer (23) of $In_{x2}Ga_{1-x2}N$ at least partially relaxed;
ii. producing a conversion structure (30), comprising an emission layer (33) configured to emit light at a second wavelength ($\lambda_2$), and an absorption layer (34) produced on the basis of InGaN;
iii. transfer of the conversion structure (30) onto the emission structure (10) in such a way that the absorption layer (34) is located between the emission structure (10) and the emission layer (33) of the conversion structure.

15 Claims, 4 Drawing Sheets

(51) Int. Cl.
    *H01L 33/32*     (2010.01)
    *H01L 27/15*     (2006.01)
    *H01L 33/50*     (2010.01)
    *H01L 25/16*     (2006.01)

(52) U.S. Cl.
    CPC .......... *H01L 33/0093* (2020.05); *H01L 33/06* (2013.01); *H01L 33/32* (2013.01); *H01L 25/167* (2013.01); *H01L 27/153* (2013.01); *H01L 33/502* (2013.01); *H01L 2933/0041* (2013.01)

(56) References Cited

U.S. PATENT DOCUMENTS

| | | | | |
|---|---|---|---|---|
| 7,141,445 | B2* | 11/2006 | Sugawara | H01L 33/30 438/41 |
| 8,896,076 | B2* | 11/2014 | Saito | H01L 31/1852 257/431 |
| 9,331,233 | B2* | 5/2016 | Dussaigne | H01L 31/1848 |
| 9,331,252 | B2* | 5/2016 | Schubert | H01L 33/32 |
| 9,530,927 | B2* | 12/2016 | Basceri | H01L 33/0075 |
| 9,905,725 | B2* | 2/2018 | Lee | H04B 10/70 |
| 10,096,748 | B2* | 10/2018 | Schubert | H01L 33/18 |
| 10,103,195 | B2* | 10/2018 | Damilano | H01L 33/32 |
| 10,276,745 | B2* | 4/2019 | Robin | H01L 33/32 |
| 2002/0030197 | A1 | 3/2002 | Sugawara et al. | |
| 2003/0205714 | A1 | 11/2003 | Sugawara et al. | |
| 2005/0040427 | A1 | 2/2005 | Sugawara et al. | |
| 2008/0284329 | A1* | 11/2008 | Bertram | H01L 33/504 313/506 |
| 2012/0097921 | A1 | 4/2012 | Smith et al. | |
| 2013/0049569 | A1 | 2/2013 | Schubert et al. | |
| 2013/0256689 | A1* | 10/2013 | Pougeoise | H01L 33/385 257/76 |
| 2014/0048818 | A1* | 2/2014 | Saito | H01L 33/30 257/76 |
| 2014/0327037 | A1* | 11/2014 | Dussaigne | H01L 21/0237 257/103 |
| 2016/0027957 | A1* | 1/2016 | Basceri | H01L 33/0075 438/29 |
| 2016/0049544 | A1* | 2/2016 | Robin | H01L 33/0025 257/13 |
| 2016/0099544 | A1* | 4/2016 | Hoshino | H01S 5/0092 356/432 |
| 2016/0211423 | A1 | 7/2016 | Schubert et al. | |
| 2017/0018679 | A1* | 1/2017 | Lee | H01L 33/06 |
| 2017/0213868 | A1 | 7/2017 | Damilano et al. | |
| 2018/0323339 | A1* | 11/2018 | Robin | H01L 33/0025 |
| 2019/0189835 | A1* | 6/2019 | Dussaigne | H01L 33/32 |
| 2019/0334064 | A1* | 10/2019 | Pourquier | H01L 33/505 |

OTHER PUBLICATIONS

French Preliminary Search Report dated Oct. 18, 2018 in French Application 17 62422, filed on Dec. 19, 2017 (with English Translation of Categories of Cited Documents & Written Opinion).

* cited by examiner

Fig.2B

METHOD OF MANUFACTURING AN OPTOELECTRONIC DEVICE BY TRANSFERRING A CONVERSION STRUCTURE ONTO AN EMISSION STRUCTURE

TECHNICAL FIELD

The field of the invention is that of optoelectronic devices comprising a structure emitting a first light radiation, for example blue light, and a conversion structure of at least part of the first light radiation into at least one second light radiation of higher wavelength, for example green or red light.

PRIOR ART

Optoelectronic devices are known that comprise an emission structure comprising one or more light-emitting diodes, the latter generally being formed of a stack of semiconducting layers suitable for emitting light radiation, for example blue light. The semiconducting layers are usually made predominantly of a semiconducting compound, for example III-V, i.e. comprising elements from column III and column V of the periodic table, such as a III-N compound, for example gallium nitride (GaN), indium gallium nitride (InGaN) or aluminium gallium nitride (AlGaN).

For emitting a second light radiation at another wavelength, the optoelectronic device may comprise a conversion structure arranged on the emission structure so as to cover a transmission surface of the latter. The conversion structure may thus be configured to absorb at least part of the first light radiation from the emission structure, and for emitting in response a second light radiation at a wavelength higher than that of the original first light radiation. As an example, the conversion structure may absorb blue light emitted by the light-emitting diode or diodes, and emit green light in response.

Patent application WO2017/001760 A1 describes an example of an optoelectronic device of this kind in which the conversion structure is formed of a photoluminescent layer comprising phosphors, the latter being in the form of powder or grains dispersed in a transparent and optically inert binding matrix. Such phosphors may be selected from yttrium aluminium garnet (YAG) and semiconducting nanocrystals forming quantum dots.

However, there is a need for a method of fabricating an optoelectronic device produced on the basis of one and the same semiconducting compound, so that the emission structure and the conversion structure are both produced on the basis of the same semiconducting compound, for example based on gallium nitride or alloys thereof, the semiconducting compound then having good crystal quality.

One approach may consist of producing the conversion structure by epitaxial growth of a stack of conversion layers based on InGaN, this stack being configured to provide optical conversion of the light radiation emitted by the emission structure. However, it may be necessary to produce a conversion structure comprising quantum wells of InGaN having a high atomic proportion of indium, for example of the order of about 25% in the case of conversion of blue light to green light. Now, the large mismatch of lattice parameter between GaN and InGaN with 25% indium is likely to cause degradation of the crystal quality of InGaN.

Moreover, the conversion structure may be formed of an alternation of barrier layers of GaN and layers forming quantum wells of InGaN. As the absorption and emission of the light radiation emitted by the underlying light-emitting diode take place in the layers of InGaN, it may be necessary to produce a large number of quantum wells of InGaN to convert a high proportion of the blue light emitted. Thus, to convert close to 80% of the blue light, it may be necessary to produce at least 20 quantum wells of InGaN each with a thickness of about 3 nm. Such a configuration may also lead to degradation of the crystal quality of the InGaN contained in the conversion structure.

DISCLOSURE OF THE INVENTION

The invention aims to remedy the drawbacks of the prior art at least partly, and more particularly to propose a method of fabricating an optoelectronic device based on gallium nitride, comprising an emission structure and a conversion structure having good crystal quality.

For this purpose, the invention relates to a method of fabricating an optoelectronic device produced on the basis of GaN, comprising an emission structure comprising an active zone configured to emit a first light radiation at the first wavelength. The method comprises the following steps:

i. producing a growth structure comprising a nucleation layer of $In_{x2}Ga_{1-x2}N$ at least partially relaxed;
ii. producing a conversion structure, by epitaxial growth starting from the growth structure, comprising an emission layer produced on the basis of InGaN starting from the nucleation layer and comprising an active zone configured to emit light radiation at a second wavelength greater than a first wavelength, and an absorption layer produced on the basis of InGaN starting from the emission layer and configured to absorb the first light radiation at least partially;
iii. transferring the conversion structure onto the emission structure so that the absorption layer is located between the emission structure and the emission layer of the conversion structure.

Certain preferred, but non-limiting, aspects of this method of manufacturing are as follows.

The absorption layer may be made of $In_{x6}Ga_{1-x6}N$, the atomic proportion of indium x6 being selected so that the absorption layer has an energy bandgap $Eg(In_{x6}Ga_{1-x6}N)$ less than $h \cdot c/\lambda_1$, h being the Boltzmann constant and c the speed of light, $\lambda_1$ being the first wavelength.

The emission layer may form an active zone comprising an alternation of barrier layers of $In_{x4}Ga_{1-x4}N$ such that x4 is greater than or equal to x2, and of at least one emitting layer of $In_{x5}Ga_{1-x5}N$ forming a quantum well inserted between two barrier layers, the atomic proportion of indium x4 of the barrier layers being selected so that they have an energy bandgap $Eg(In_{x4}Ga_{1-x4}N)$ less than $h \cdot c/\lambda_1$.

The active zone of the emission structure may comprise at least one quantum well of $In_{x1}Ga_{1-x1}N$, the atomic proportion of indium x4 being greater than or equal to x1 and less than x5.

The active zone of the emission structure may comprise at least one quantum well of $In_{x1}Ga_{1-x1}N$, the absorption layer being made of $In_{x6}Ga_{1-x6}N$ with an atomic proportion of indium x6 greater than or equal to x1 and less than x5.

The atomic proportion of indium x5 may be between 22% and 30%.

The nucleation layer may be made of $In_{x2}Ga_{1-x2}N$ with an atomic proportion of indium x2 between 1% and 14%.

The nucleation layer may have a lattice parameter equal to its natural value to within 0.75% in compression and to within 0.15% in tension, and preferably equal to its natural value to within ±0.03%.

The emission layer may form an active zone comprising an alternation of barrier layers of $In_{x4}Ga_{1-x4}N$ such that x4 is greater than or equal to x2, and of at least one emitting layer of $In_{x5}Ga_{1-x5}N$ forming a quantum well inserted between two barrier layers, in which step ii of production of the conversion structure comprises production of a buffer layer, produced on the basis of $In_{x3}Ga_{1-x3}N$ starting from the nucleation layer, configured to allow lattice adaptation between the $In_{x2}Ga_{1-x2}N$ of the nucleation layer and the $In_{x4}Ga_{1-x4}N$ of a barrier layer of the emission layer with which it is intended to be in contact.

The buffer layer may be formed of an alternation of layers based on GaN and of layers of $In_{x3'}Ga_{1-x3'}N$.

The layers of $In_{x3'}Ga_{1-x3'}N$ may have an atomic proportion of indium x3' greater than or equal to x4.

The buffer layer may be made of $In_{x3}Ga_{1-x3}N$ with an atomic proportion of indium x3 that increases between the value x2 at the interface with the nucleation layer and the value x4 at the interface with the barrier layer of the emission layer in contact with the buffer layer.

The growth structure may be formed of a stack of a supporting layer, a binding layer and the nucleation layer.

The nucleation layer may be formed by transferring a layer of $In_{x2}Ga_{1-x2}N$ grown epitaxially beforehand starting from a growth substrate onto the binding layer, followed by separation of the layer of $In_{x2}Ga_{1-x2}N$ into two parts at the level of a zone weakened after prior ion implantation, the part in contact with the binding layer forming the nucleation layer.

The method may comprise, following the transfer step iii, removing the supporting layer and the binding layer from the growth structure.

BRIEF DESCRIPTION OF THE DRAWINGS

Other aspects, aims, advantages and features of the invention will become clearer on reading the following detailed description of preferred embodiments of the invention, given as non-limiting examples, and referring to the appended drawings, in which.

DETAILED DESCRIPTION OF PARTICULAR EMBODIMENTS

In the figures and in the rest of the description, the same references represent identical or similar elements. Moreover, the various elements are not shown to scale, for the sake of clarity of the figures. Moreover, the various embodiments and variants are not exclusive of one another and may be combined with one another. Unless stated otherwise, the terms "approximately", "about", "of the order of" mean to within 10%. Moreover, the expression "comprising a" is to be understood as "comprising at least one", unless stated otherwise.

The invention relates to a method of fabricating an optoelectronic device 1 comprising:
an emission structure 10 formed of at least one light-emitting diode configured to emit a first light radiation at a first wavelength $\lambda_1$, for example blue light, and
a conversion structure 30 configured to absorb the light radiation emitted by the light-emitting diode from the emission structure 10 and to emit in response at least one second light radiation at a second wavelength $\lambda_2$, the latter then being greater than $\lambda_1$, for example green or red light.

In general, blue light corresponds to a spectrum comprising a peak intensity at a wavelength between about 440 nm and 490 nm, green at a wavelength between about 495 nm and 560 nm, and red at a wavelength between about 600 nm and 650 nm.

The optoelectronic device 1 is produced on the basis of one and the same semiconducting crystalline compound, and more precisely based on gallium nitride GaN. In other words, the emission structure 10 and the conversion structure 30 are produced on the basis of GaN, i.e. they are produced predominantly of GaN or an alloy thereof.

The emission structure 10 may be described as active in the sense that it is configured to emit (i.e. adapted for emitting) a first light radiation, for example blue light, owing to electrical polarization of the light-emitting diode or diodes. The conversion structure 30 may be described as passive in the sense that it is configured to emit a second light radiation in response to absorption of at least part of the first light radiation from the emission structure 10. Thus, the conversion structure 30 is not polarized electrically by means of electrodes.

FIGS. 1A to 1F are cross-sectional views illustrating schematically various steps of a method of fabricating an optoelectronic device 1 according to one embodiment.

Here, and for the rest of the description, an orthogonal three-dimensional direct reference system (X,Y,Z) is defined, where the X and Y axes form a plane parallel to the principal planes over which the emission structure 10 and the conversion structure 30 extend, and where the Z axis is oriented approximately orthogonally to the XY plane following a direction of luminous emission from the optoelectronic device 1.

Figure 1A:
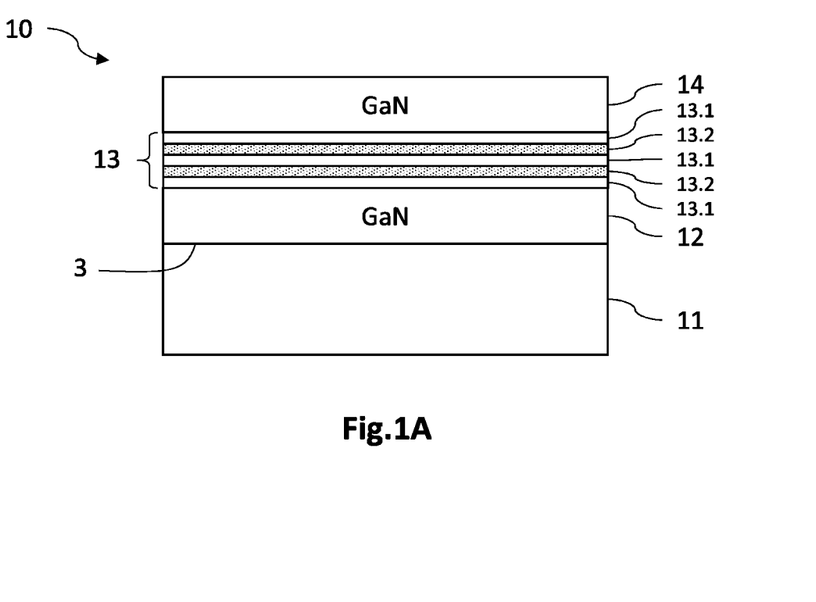
FIGS. 1A to 1F are sectional views illustrating schematically various steps of a method of manufacturing an optoelectronic device according to one embodiment.
Figure 1B:
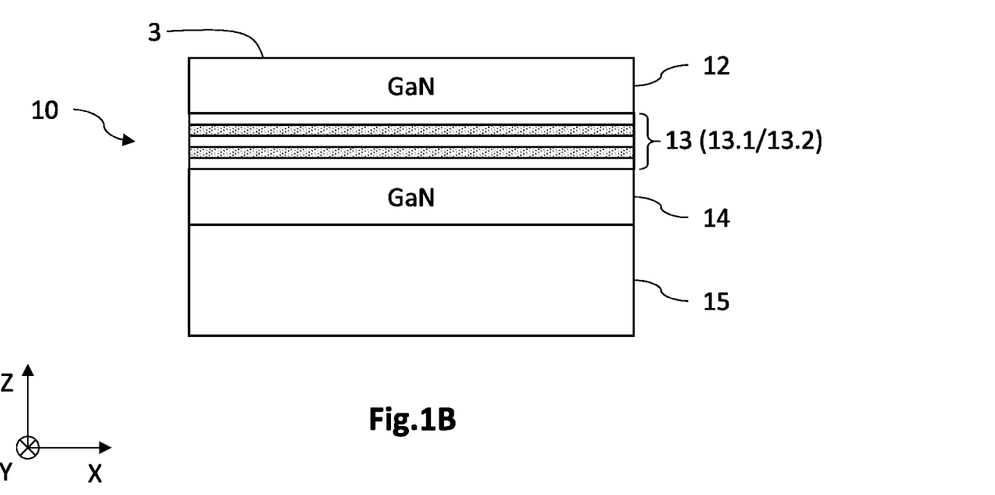

FIGS. 1A and 1B illustrate a preliminary step of producing an emission structure 10 comprising at least one light-emitting diode based on a control chip 15.

The emission structure 10 comprises a stack of semiconducting layers 12, 13, 14 forming one or more light-emitting diodes, this stack resting on a control chip 15. A single light-emitting diode is shown here.

Firstly (FIG. 1A), the stack of semiconducting layers 12, 13, 14 forming one or more light-emitting diodes is produced by epitaxial growth starting from a growth substrate 11. The growth substrate 11 may be made of an insulating material, for example sapphire, or of semiconductor material, for example silicon or based on a III-V or II-VI compound. It may be a bulk substrate or a stack of separate layers such as a silicon-on-insulator (SOI) substrate.

The light-emitting diode or diodes are therefore formed of a stack of semiconducting layers 12, 13, 14 produced on the basis of GaN, i.e. made predominantly of GaN or alloys thereof. It thus comprises a first layer 12 doped with a first type of conductivity, for example n-doped GaN, and a second layer 14 doped with a second type of conductivity opposite to the first type, for example p-doped GaN, between which there is an active zone 13. The active zone 13 is the region of the light-emitting diode from which the first light radiation of wavelength $\lambda_1$ is mainly emitted. The face of the first n-doped layer 12, opposite the active zone 13, is intended to form a transmission surface 3, through which the first light radiation is emitted. The conversion structure 30 will lie on this face 3. As an illustration, the p-doped layer 14 may have a thickness between 50 nm and 20 μm and the n-doped layer 12 may have a thickness between 0.1 μm and 20 μm. The p-doped layer 14 may comprise an electron-blocking interposed layer (not shown) located at the interface with the active zone 13. The doped layers 12, 14 may have a density of dopants that is uniform or variable depending on the thickness of the layers.

The active zone 13 is formed of a stack of barrier layers 13.1 and of at least one emitting layer 13.2 forming a quantum well. Preferably, the active zone 13 comprises several quantum wells 13.2, each being located between two barrier layers 13.1. The active zone 13 is also produced on the basis of GaN. Thus, the layers 13.2 forming the quantum wells are preferably made of $In_{x1}Ga_{1-x1}N$ with an atomic proportion of indium x1 of, for example, between about 9% and 18% when the first light radiation emitted is blue light, preferably equal to about 16%. They may have a thickness between about 1 nm and 7 nm. The barrier layers 13.1 may be made of GaN, or even of InGaN with an atomic proportion of indium less than x1, and may have a thickness between about 1 nm and 50 nm. The layers 13.1, 13.2 of the active zone 13 are preferably not intentionally doped. The active zone 13 may have a thickness between about 10 nm and 500 nm.

The stack of semiconducting layers forming the light-emitting diode or diodes may be produced by conventional epitaxy techniques such as chemical vapour deposition (CVD), for example metal-organic chemical vapour deposition (MOCVD), molecular beam epitaxy (MBE), hydride vapour phase epitaxy (HVPE), atomic layer epitaxy (ALE), atomic layer deposition (ALD), or by evaporation or cathode sputtering.

The stack of semiconducting layers further comprises electrically conducting portions (not shown) configured to provide electrical polarization of the light-emitting diode or diodes.

Secondly (FIG. 1B), the stack of semiconducting layers 12, 13, 14 may be transferred onto a control chip 15, followed by removal of the growth substrate 11. The control chip 15 comprises connecting elements (not shown) making it possible to polarize the light-emitting diode or diodes. It may comprise electronic elements, of the transistor type, providing control of emission of the light-emitting diode. Alternatively, it may be a passive component essentially only comprising electrical lines of connection extending as far as the displaced electronic elements.

As described later with reference to FIGS. 2A and 2B, steps of structuration of the stack of semiconducting layers 12, 13, 14 may be carried out so as to produce a plurality of light-emitting diodes separate from one another. This structuring phase comprises steps of depositing dielectric layers and electrically conducting layers, as well as steps of photolithography and etching. They may be carried out before or after the step of transfer to the control chip. The light-emitting diodes may have a structure identical to or similar to that described in the work of Fan et al. titled *III-nitride micro-emitter arrays development and applications*, J. Phys. D: Appl. Phys., 41 (2008) 094001. As a variant, and preferably, they may be identical or similar to the structure described in patent application EP2960940 A1.

Thus, an emission structure 10 is obtained that is configured to emit a first light radiation, having an approximately flat emission face 3 intended to receive the conversion structure 30. Here, the transmission face 3 is formed by a face of one of the doped layers, here the n-doped layer 12. As a variant, it may be formed by a face of an interposed plate or layer made of a dielectric material, transparent and optically inert with respect to the first light radiation, for example a silicon oxide or nitride, or even glass, pyrex or some other. The thickness of this interposed layer may be between 500 nm and 50 μm, for example between 1 μm and 5 μm.

Figure 1C:
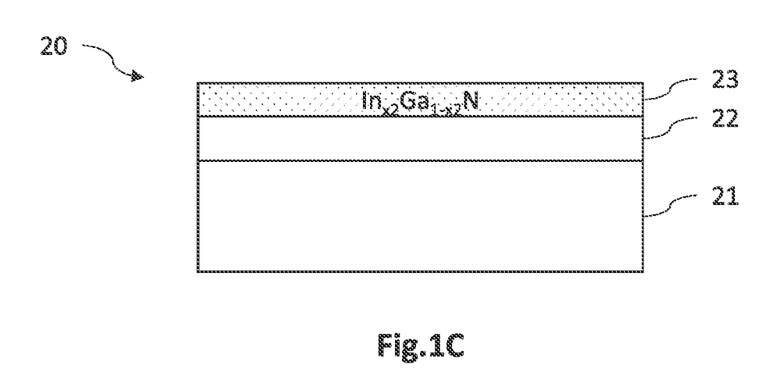

FIG. 1C illustrates a step of producing a growth structure 20. The latter comprises a nucleation layer 23, or germination layer, made of $In_{x2}Ga_{1-x2}N$ at least partially relaxed, i.e. partially relaxed or preferably relaxed. Partially relaxed InGaN means that the compound has a lattice parameter equal to its natural value to within 0.75% in compression and to within 0.15% in tension. Relaxed InGaN means that its lattice parameter is equal to its natural value to within ±0+0.03%. The natural value of the lattice parameter is the value when the compound is not subjected to mechanical stresses, notably in tension or in compression. The lattice parameter may be measured by X-ray diffraction, by mapping the reciprocal lattice. As an example, for InGaN with 8% indium, the natural lattice parameter is equal to 3.215 Å. It is said to be partially relaxed if the lattice parameter is between 3.191 Å and 3.220 Å, and is regarded as relaxed if the lattice parameter is equal to 3.215 Å to within ±0.001 Å.

The nucleation layer 23 is preferably the upper layer of a stack of separate layers 21, 22, 23. It may thus be a structure called InGaNoS (InGaN-on-Substrate) formed of a supporting layer 21, for example a substrate of sapphire ($Al_2O_3$) or of silicon (Si), a binding layer 22 made of a dielectric material, and the nucleation layer 23 of $In_{x2}Ga_{1-x2}N$ at least partially relaxed and preferably relaxed.

This growth structure 20 may be obtained by a method of manufacturing described notably in patent application EP2330697 A1. Thus, firstly, a layer of $In_{x2}Ga_{1-x2}N$ is grown epitaxially starting from a temporary growth substrate, for example a layer of GaN formed on a sapphire substrate. The layer of $In_{x2}Ga_{1-x2}N$ may have a thickness less than its critical thickness, starting from which plastic relaxation of the mechanical stresses takes place, to limit the formation of structural defects. The relaxed character of the layer of $In_{x2}Ga_{1-x2}N$ may be improved by successive annealing. As a variant, the layer of $In_{x2}Ga_{1-x2}N$ may be a so-called thick layer, in the sense that its thickness is greater than its critical thickness. Then implantation of $H^+$ ions (Smart Cut™ technology) is performed in the thick layer of $In_{x2}Ga_{1-x2}N$ to form a weakened zone that facilitates transfer onto the supporting layer. Next, the thick layer of $In_{x2}Ga_{1-x2}N$ is bonded to a binding layer 22 of a dielectric material, for example a silicon oxide or nitride, deposited beforehand on the supporting layer 21, which may be a sapphire substrate. The growth substrate is removed and finally the thick layer of $In_{x2}Ga_{1-x2}N$ is separated into two parts at the level of the zone weakened by implantation of $H^+$ ions. A growth structure 20 is thus obtained, formed of a stack comprising the supporting layer 21, the binding layer 22 and the nucleation layer 23 of $In_{x2}GaN$ at least partially relaxed. The latter may have a thickness for example between 5 nm and 500 nm. Owing to its partially relaxed and preferably relaxed structure, it has a particularly low density of structural defects such as lattice mismatch dislocations. In the case of conversion from blue light to green light, the atomic proportion of indium x2 may be between 1% and 14%, and preferably between 1% and 8%.

Figure 1D:
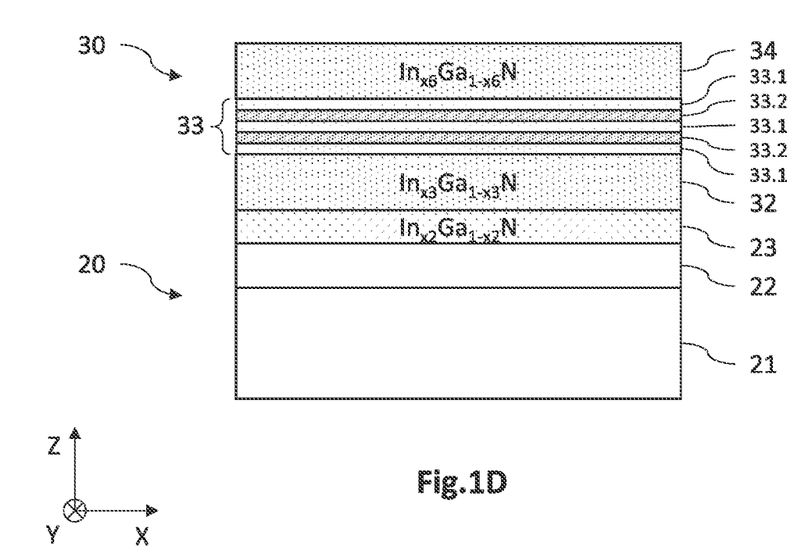

FIG. 1D illustrates a step of production of the conversion structure 30, by epitaxial growth starting from the growth structure 20. Epitaxial growth may be carried out by one of the techniques mentioned above.

The conversion structure 30 comprises a stack of semiconducting layers 32, 33, 34 produced on the basis of GaN, and more precisely based on InGaN, namely an optional, but advantageous, buffer layer 32, an emission layer 33, and an absorption layer 34.

Firstly, the buffer layer 32 is formed, by epitaxy starting from the nucleation layer 23 of $In_{x2}Ga_{1-x2}N$. This buffer layer 32 is configured to allow adaptation of the lattice parameter between the nucleation layer 23 and the emission layer 33, and more precisely with a first barrier layer 33.1 of $In_{x4}Ga_{1-x4}N$ with which it is in contact. This buffer layer 32 may be omitted in the case when the nucleation layer 23 of $In_{x2}Ga_{1-x2}N$ and the first barrier layer 33.1 of $In_{x4}Ga_{1-x4}N$ have the same value of atomic proportion of indium x2=x4, which is reflected in the same value of lattice parameter. It is, preferably, present when these layers have different lattice parameters, notably when x2 is less than x4. As an example, the nucleation layer 23 may be made of $In_{x2}Ga_{1-x2}N$ with x2=approx. 8% and the first barrier layer 33.1 of $In_{x4}Ga_{1-x4}N$ with x4=approx. 17%. In this case, the lattice-adapting buffer layer 32 is advantageously provided.

The buffer layer 32 is produced on the basis of $In_{x3}Ga_{1-x3}N$ with an atomic proportion of indium x3, this value being constant or variable depending on the thickness of the layer. Thus, locally, depending on the thickness of the layer, it may be between about x2 and x4. Its thickness may be between 5 nm and 10 μm.

According to one variant, it may thus be made of $In_{x3}Ga_{1-x3}N$ with an atomic proportion of indium x3 that varies depending on its thickness, and more precisely that increases between a low value equal to the atomic proportion of indium x2 at the interface with the nucleation layer 23 of $In_{x2}Ga_{1-x2}N$, and a high value equal to the atomic proportion of indium x4 at the interface with the first barrier layer 33.1 of $In_{x4}Ga_{1-x4}N$ of the emission layer 33. Its thickness may be between 5 nm and 10 μm. In the case of conversion of blue light to green light, it may thus have an atomic proportion of indium x3 varying continuously between 8% of $In_{x2}Ga_{1-x2}N$ and 17% of $In_{x4}Ga_{1-x4}N$.

According to another variant (not shown), the buffer layer 32 may be formed of a stack of semiconducting layers in which thin layers of (Al,Ga)N and layers of $In_{x3}Ga_{1-x3}N$ alternate. The atomic proportion of indium x3 may be equal to the value x4 at the interface with the $In_{x4}Ga_{1-x4}N$ of the first barrier layer 33.1, for example 17% in the case of conversion from blue light to red light. The atomic proportion of indium x3 may be identical for all the layers of $In_{x3}Ga_{1-x3}N$, or may vary depending on the thickness, between a low value equal to about x2 and a high value equal to about x4, as mentioned above. The layers of (Al,Ga)N may have a thickness between 0.25 nm and 50 nm, preferably equal to 2 nm, and the layers of $In_{x3}Ga_{1-x3}N$ may have a thickness between 2.5 nm and 100 nm, for example equal to 20 nm. The buffer layer 32 may have a total thickness between 10 nm and 10 μm, for example equal to 500 nm.

According to another variant (not shown), the buffer layer 32 may have a superlattice structure and be formed of a stack of semiconducting layers in which there are alternate layers of $In_{x3'}Ga_{1-x3'}N$ and layers based on (Ga,In)N, the atomic proportion x3' being adapted so that the buffer layer 32 corresponds to an equivalent layer made of $In_{x3}Ga_{1-x3}N$ with an average atomic proportion of indium x3 equal to about x4. The layers of $In_{x3'}Ga_{1-x3'}N$ preferably have an atomic proportion of indium x3' that may be identical for all the layers of $In_{x3'}Ga_{1-x3'}N$. The layers based on (Ga,In)N may be made of GaN or of InGaN with an atomic proportion of indium lower than that of the $In_{x3'}Ga_{1-x3'}N$ and have a thickness of the order of 0.25 nm to 10 nm, preferably equal to 2 nm. The layers of $In_{x3'}Ga_{1-x3'}N$ preferably have a thickness of the same value or even less than that of the layers of GaN, for example equal to half. Thus, the layers of $In_{x3'}Ga_{1-x3'}N$ may have a high concentration of indium but their smaller thickness makes it possible to avoid plastic relaxation, which could form structural defects. As an example, the layers of GaN and of $In_{x3'}Ga_{1-x3'}N$ have one and the same thickness, for example equal to 2 nm, and the atomic proportion of indium x3' is equal to twice x4, giving a buffer layer 32 corresponding to an equivalent layer made of $In_{x3}Ga_{1-x3}N$ with x3=x4.

Secondly, the emission layer 33 is produced by epitaxy starting from the buffer layer 32 when it is present, or starting from the nucleation layer 23 if applicable. The emission layer 33 forms the active zone of the conversion structure 30 in the sense that it corresponds to the region from which the second light radiation is predominantly emitted in response to absorption of the first light radiation. It is formed of a stack of barrier layers 33.1 of $In_{x4}Ga_{1-x4}N$ and of at least one emitting layer 33.2 forming a quantum well of $In_{x5}Ga_{1-x5}N$. Preferably, it comprises several quantum wells 33.2, each located between two barrier layers 33.1. The layers 33.1, 33.2 of the active zone 33 are preferably not intentionally doped.

The barrier layers 33.1 are made of $In_{x4}Ga_{1-x4}N$ with an atomic proportion of indium x4 less than x5. Preferably, the atomic proportion of indium x4 is selected so that the barrier layers 33.1 have an energy bandgap $Eg(In_{x4}Ga_{1-x4}N)$ less than $h \cdot c/\lambda_1$, thus also allowing absorption of at least part of the first light radiation. Thus, in the case of conversion of blue light to green light, it may be greater than or equal to the atomic proportion x1 of the emitting layers 13.2 of the emission structure 10, for example it may be equal to about 17%, while being less than the atomic proportion of indium x5 of the $In_{x5}Ga_{1-x5}N$ of the quantum wells 33.2 of the emission layer 33. They may have a thickness between about 1 nm and 50 nm. A first barrier layer 33.1 is in contact with the buffer layer 32 when it is present, or if applicable with the nucleation layer 23.

The quantum wells 33.2 are made of $In_{x5}Ga_{1-x5}N$ with an atomic proportion of indium x5 for example between about 22% and 30% when the second light radiation emitted is green light, and preferably equal to about 25%. It may be between about 30% and 40% for emission in the red, for example it may be equal to about 35%. The layers 33.2 forming the quantum wells may have a thickness between about 1 nm and 8 nm.

Thirdly, the absorption layer 34 is produced by epitaxy starting from the emission layer 33, and more precisely starting from a last barrier layer 33.1 located on the side opposite the first barrier layer 33.1 that is in contact with the buffer layer 32. It is intended to allow absorption of at least part of the first light radiation emitted by the emission structure 10. During absorption in the absorption layer 34, an electron-hole pair is formed and these charge carriers may then recombine radiatively in a quantum well of the emission layer 33. The absorption layer 34 is produced on the basis of GaN and more precisely is made of $In_{x6}Ga_{1-x6}N$ with an atomic proportion of indium x6 that is preferably uniform within the layer. It has a thickness between 10 nm and 10 μm, and preferably greater than 100 nm to contribute to efficient absorption of the first light radiation. In the case of conversion of blue light to green light, the absorption layer 34 has an atomic proportion of indium x6 selected so that it has an energy bandgap $Eg(In_{x6}Ga_{1-x6}N)$ less than $h \cdot c/\lambda_1$, thus allowing at least partial absorption of the blue light emitted by the emission structure 10. It may thus be greater than or equal to the atomic proportion x1 of the emitting layers 13.2 of the emission structure 10, for example it may be equal to 17% and may be less than the atomic proportion of indium x5 of the $In_{x5}Ga_{1-x5}N$ of the quantum wells 33.2 of the emission layer 33.

Thus, an emission structure 30 is obtained, made predominantly of InGaN, comprising an emission layer 33 and an absorption layer 34, and if applicable a buffer layer 32 in contact with the face of the emission layer 33 opposite the absorption layer 34. The barrier layers 33.1 of the emission layer 33 are advantageously configured to absorb at least part of the first light radiation.

Figure 1E:
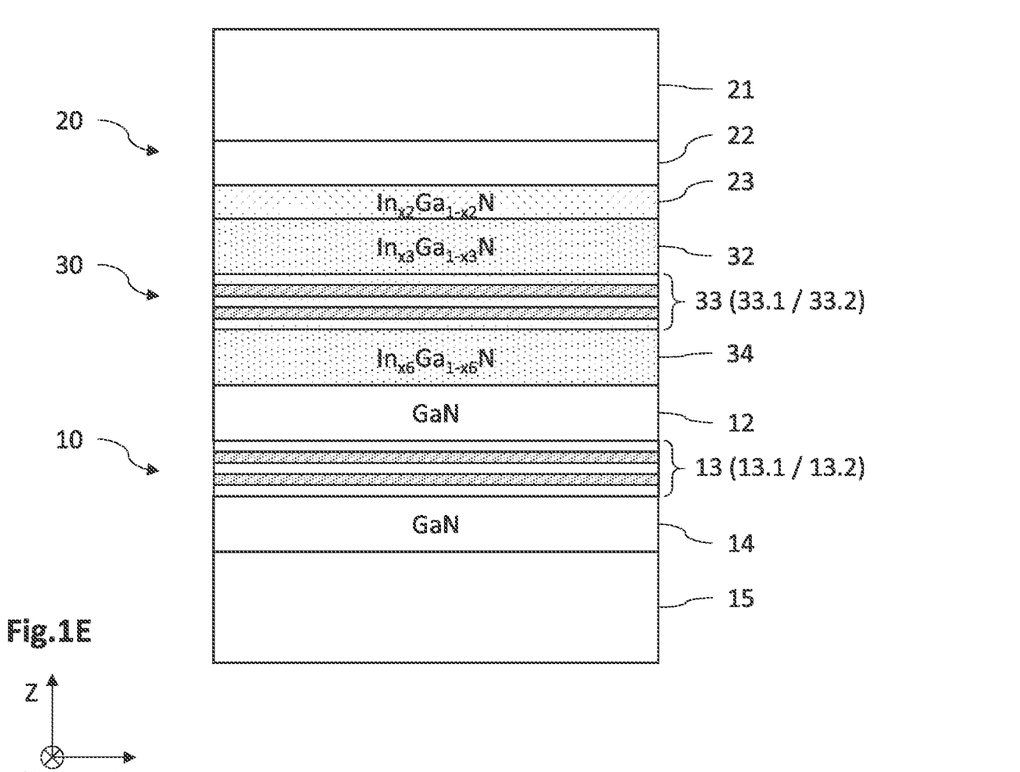

FIG. 1E illustrates a step of transfer of the conversion structure 30 onto the emission structure 10. More precisely, the conversion structure 30 is assembled on the emission structure 10 in such a way that the free face of the absorption layer 34 is fixed to the transmission face 3 of the emission structure 10. The free face 3 of the emission structure 10 may be that of the doped layer (as shown in FIG. 1E) or that of an interposed layer (not shown). Thus, the absorption layer 34 is located between the emission structure 10 on the one hand, and the emission layer 33 on the other hand. This step may be carried out by one of the conventional techniques for transfer and assembly, for example by gluing the two structures 10, 30 using an epoxy adhesive, the latter being transparent to the first light radiation and advantageously electrically insulating. Other techniques are possible, for example such as direct gluing, among others.

Figure 1F:
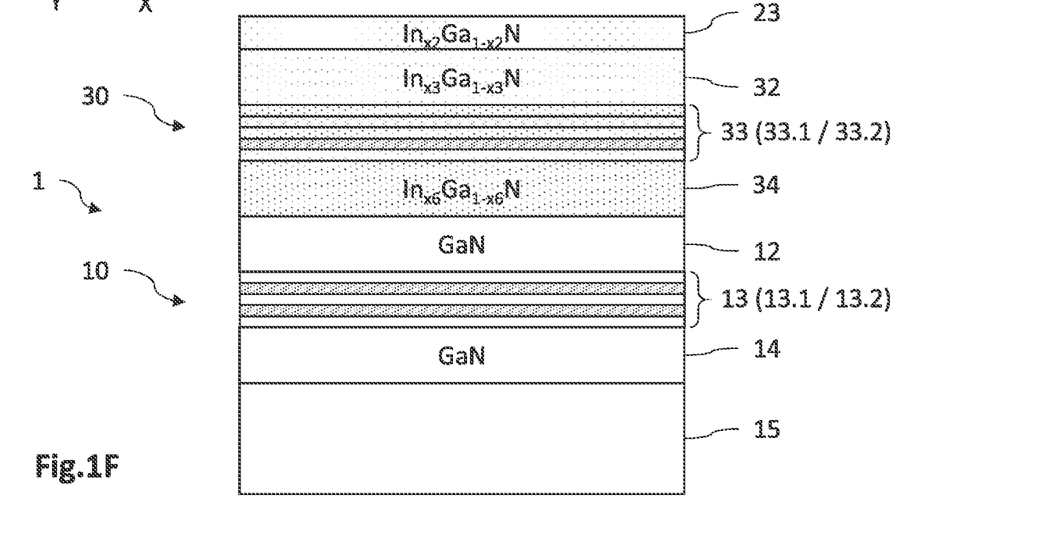

FIG. 1F illustrates a step of removing the supporting layer 21 and the binding layer 22 from the growth structure 20. This removal step may be carried out by grinding and/or etching, or even by means of a laser by a method of the laser lift-off type. The nucleation layer 23 of $In_{x2}Ga_{1-x2}N$, at least partially relaxed, may be kept (as shown in FIG. 1F) or removed.

Thus, the method of manufacturing makes it possible to obtain an optoelectronic device 1 based on the same semiconducting compound, namely in this case of gallium nitride and alloys thereof, more precisely comprising an emission structure 10 made predominantly of GaN and a conversion structure 30 made predominantly of InGaN. This optoelectronic device 1 therefore allows emission of at least one second light radiation of wavelength $\lambda_2$, for example green or red light, in response to absorption of a first excitation light radiation of lower wavelength $\lambda_1$, for example blue light.

The conversion structure 30 based on InGaN may thus comprise quantum wells 33.2 with a high atomic proportion of indium, thus allowing conversion in the green or red, while having good crystal quality. These structural characteristics are possible by using a nucleation layer 23 of InGaN at least partially relaxed, here preferably obtained by InGaNoS (InGaN-on-Substrate) technology. In fact, it appears that a nucleation layer 23 of InGaN at least partially relaxed allows more indium to be incorporated in the epitaxial layers 32, 33, 34 based on InGaN while minimizing the presence of structural defects such as lattice mismatch dislocations. The optical properties of the optoelectronic device 1 are thus improved.

It is then possible to improve the conversion rate, i.e. number of photons emitted of the second light radiation by the number of photons emitted of the first light radiation, by producing quantum wells 33.2 of the conversion structure 30 with good internal quantum efficiency, and notably barrier layers 33.1 that also allow absorption of the first light radiation, in addition to the absorption layer 34.

As an example, in the case of conversion of blue light to green light, the optoelectronic device 1 emits, in the direction of the conversion structure 30, blue light at the level of the emitting layers 13.2 of $In_{x1}Ga_{1-x1}N$ with x1 equal to about 15%. The conversion structure 30 absorbs at least part of the blue light, in the absorption layer 34 made of $In_{x6}Ga_{1-x6}N$ with x6 equal to about 17% (x1≤x6<x5), and preferably also in the barrier layers 33.1 made of $In_{x4}Ga_{1-x4}N$ with x4 equal to about 17% (x1≤x4<x5), and emits in response a second light radiation of higher wavelength, green light here, at the level of the emitting layers 33.2 made of $In_{x5}Ga_{1-x5}N$ with x5 equal to about 25%.

In the embodiment described above, the absorption layer 34 and the buffer layer 32 are separate from the first and last barrier layers 33.1 of the emission layer 33. However, as a variant, they may be merged with the latter.

Moreover, the emission structure 10 may be formed of a stack of continuous semiconducting layers (as shown in FIG. 1A-1F). As a variant, it may comprise a plurality of light-emitting diodes separate from one another. Moreover, the conversion structure 30 may be in the form of a stack of continuous semiconducting layers extending opposite the emission structure 10. As a variant, it may be in the form of a plurality of studs separate from one another, the studs being formed by localized etching of the initial stack of semiconducting layers 32, 33, 34. Each conversion stud may extend opposite one or more light-emitting diodes.

Figure 2A:
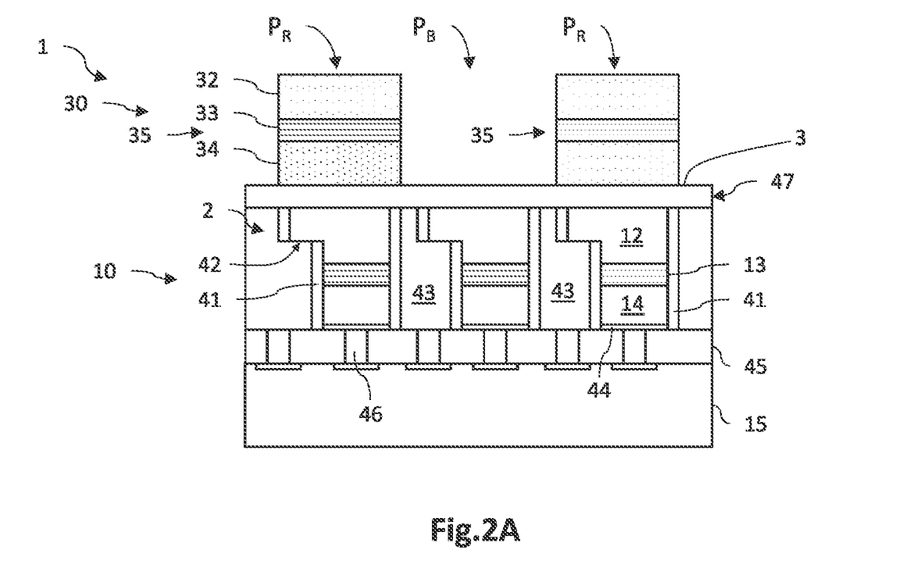
FIGS. 2A and 2B are schematic, partial sectional views of optoelectronic devices obtained by the method of manufacturing according to variant embodiments.

Thus, FIG. 2A is a sectional view illustrating schematically an optoelectronic device 1 obtained according to another embodiment of the method of manufacturing. Here, the emission structure 10 comprises several light-emitting diodes 2, which may be connected to one another in parallel or in series. The conversion structure 30 comprises several conversion studs 35, obtained from the same stack of semiconducting layers 32, 33, 34, each arranged opposite a light-emitting diode 2. Thus, the optoelectronic device comprises a matrix of luminous pixels, each luminous pixel comprising in this case a single light-emitting diode 2, which may or may not be surmounted by a conversion stud 35, the pixels being activatable independently of one another. In this example, three pixels are shown, a blue pixel PB not comprising a conversion stud 35 and two red pixels PR each comprising a conversion stud 35.

The light-emitting diodes 2 are each formed of a stack of a first doped portion 12, here of type n, and of a second doped portion 14, here of type p, between which there is an active zone 13. They form mesa structures approximately coplanar with one another. This structure of light-emitting diodes is similar or identical to that described in document EP2960940 A1. "Mesa structure" means a structure formed of a stack of semiconducting portions located projecting above a growth substrate 11 (cf. FIG. 1A), following an etching step. Mesa structures are approximately coplanar in the sense that the first doped portions 12 of the light-emitting diodes are respectively coplanar. The same applies to the active zones 13 and the second doped portions 14.

Each light-emitting diode 2 has a first doped portion 12, of which a surface 3 opposite the active zone 13 is a surface via which the light radiation is emitted from the diode. The lateral flanks of the first doped portion 12 and second doped portion 14, as well as those of the active zone 13, are covered with a dielectric layer 41, apart from a detaching surface 42 of the first doped portion 12.

The light-emitting diodes 2 are separated from one another by lateral elements 43 for electrical connection that extend along the Z axis between the diodes. Each light-emitting diode 2 is thus associated with a lateral connecting element 43 that comes into electrical contact with the detaching surface 42 of the first doped portion 12, allowing a specified electric potential to be applied to the latter. This lateral connecting element 43 is, however, electrically insulated from the adjacent diodes 2 by the dielectric layers 41 of the latter.

In this example the emission structure to comprises a layer 45 for electrical connection, which participates in formation of a supporting layer, layer 45 allowing electrical contact between the control chip 15 on the one hand, and the lateral elements 43 for electrical connection and portions 44 for electrical connection located in contact with the second doped portions 14. The connection layer 45 thus comprises connection studs 46 electrically insulated from one another by a dielectric material. Thus, the control chip 15 may apply an electric potential to one and/or other of the light-emitting diodes 2, and thus activate them independently of one another.

An interposed layer 47, made of a dielectric material transparent to the first light radiation, in this case covers the upper face of the first doped portions 12 as well as the lateral connecting elements 43. It may optionally further comprise a planarization layer. It may be made of a silicon oxide or nitride ($SiO_2$, $Si_3N_4$, SiON etc.). The face 3 of the interposed layer 47 opposite the light-emitting diodes 2 forms the transmission surface 3 of the emission structure 10. As a variant, the interposed layer 47 may be an inserted transparent plate, made of glass, for example of borosilicate glass, pyrex, sapphire or some other. The transparent plate may be assembled by gluing.

In this example, the conversion structure 30 is formed of conversion studs 35 obtained by localized etching of the stack of semiconducting layers 32, 33, 34 (cf. FIG. 1D), this stack having been assembled on the transmission surface 3 of the emission structure 10 (cf. FIG. 1E). The etching may be dry etching, for example plasma etching (RIE, ICP etc.).

Figure 2B:
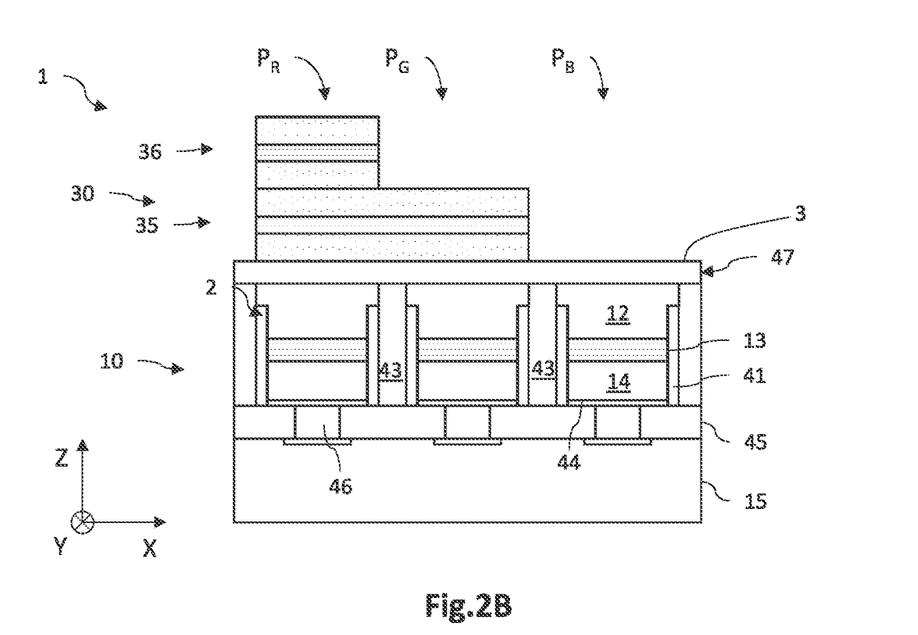

FIG. 2B is a sectional view illustrating schematically an optoelectronic device 1 obtained according to another embodiment of the method of manufacturing.

This optoelectronic device 1 differs from that in FIG. 2A notably in that the emission structure 10 comprises light-emitting diodes 2 without the detaching surface 35, and which may be connected to one another in parallel. It thus comprises a doped layer 47 according to the same type of conductivity as that of the first portions 12, and preferably overdoped, for example n+, extending continuously to contact each of the first n-doped portions 12. Thus, the first doped portions 12 may be electrically polarized via the overdoped layer 47, and the second doped portions 14 may be electrically polarized via the portions 44 for electrical connection.

This optoelectronic device 1 also differs from that in FIG. 2A in that the conversion structure 30 comprises first conversion studs 35 configured to convert at least part of the first light radiation into a second light radiation, for example into green light, and second conversion studs 36 configured to convert at least part of the second light radiation into a third light radiation, for example into red light. The first conversion studs 35 rest on the transmission surface 3 of the emission structure 10, and the second conversion studs 36 rest on the opposite face of the first conversion studs 35. Each of the first studs 35 and second studs 36 may extend opposite one or more light-emitting diodes 2. The second conversion studs 36 have an area, in the XY plane, less than or equal to that of the first conversion studs 35 on which they rest. The optoelectronic device 1 may thus comprise various types of conversion studs 35, 36, etc., configured to convert the incident light radiation into light radiation of higher wavelength.

Particular embodiments have just been described. Several variants and modifications will occur to a person skilled in the art, notably as a function of the intended applications.

The invention claimed is:

1. Method of fabricating an optoelectronic device produced on the basis of GaN, comprising:
    a emission structure comprising an active zone configured to emit a first light radiation at a first wavelength,
    the method comprising the following steps:
    i. producing a growth structure comprising:
        a nucleation layer of $In_{x2}Ga_{1-x2}N$ at least partially relaxed, x2 being the atomic proportion of indium;
    ii. producing a conversion structure, by epitaxial growth starting from the growth structure, comprising:
        an emission layer, produced on the basis of InGaN starting from the nucleation layer, comprising an active zone configured to emit light radiation at a second wavelength higher than the first wavelength, and
        an absorption layer, produced on the basis of InGaN starting from the emission layer, configured to absorb the first light radiation at least partially;
    iii. transfer of the conversion structure onto the emission structure in such a way that the absorption layer is located between the emission structure and the emission layer of the conversion structure.

2. Method according to claim 1, in which the absorption layer is made of $In_{x6}Ga_{1-x6}N$, the atomic proportion of indium x6 being selected so that the absorption layer has an energy bandgap $Eg(In_{x6}Ga_{1-x6}N)$ less than $h·c/\lambda_1$, h being the Boltzmann constant and c the speed of light, and $\lambda_1$ being the first wavelength.

3. Method according to claim 1, in which the emission layer forms an active zone comprising an alternation of barrier layers of $In_{x4}Ga_{1-x4}N$ such that the atomic proportion x4 is greater than or equal to the atomic proportion of indium x2, and at least one emitting layer of $In_{x5}Ga_{1-x5}N$ with an atomic proportion of indium x5 forming a quantum well inserted between two barrier layers, the atomic proportion of indium x4 of the barrier layers being selected so that they have an energy bandgap $Eg(In_{x4}Ga_{1-x4}N)$ less than $h·c/\lambda_1$.

4. Method according to claim 3, in which the active zone of the emission structure comprises at least one quantum well of $In_{x1}Ga_{1-x1}N$ with an atomic proportion of indium x1, the atomic proportion of indium x4 being greater than or equal to the atomic proportion of indium x1 and less than the atomic proportion of indium x5.

5. Method according to claim 3, in which the active zone of the emission structure comprises at least one quantum well of $In_{x1}Ga_{1-x1}N$ with an atomic proportion of indium x1, the absorption layer being made of $In_{x6}Ga_{1-x6}N$ with an atomic proportion of indium x6 greater than or equal to the atomic proportion of indium x1 and less than the atomic proportion of indium x5.

6. Method according to claim 3, in which the atomic proportion of indium x5 is between 22% and 30%.

7. Method according to claim 1, in which the nucleation layer is made of $In_{x2}Ga_{1-x2}N$ with an atomic proportion of indium x2 between 1% and 14%.

8. Method according to claim 1, in which the nucleation layer has a lattice parameter equal to its natural value to within 0.75% in compression and to within 0.15% in tension, and preferably equal to its natural value to within ±0.03%.

9. Method according to claim 1, in which the emission layer forms an active zone comprising an alternation of barrier layers of $In_{x4}Ga_{1-x4}N$ such that the atomic proportion of indium x4 is greater than or equal to the atomic proportion of indium x2, and at least one emitting layer of $In_{x5}Ga_{1-x5}N$ forming a quantum well inserted between two barrier layers, in which step ii of production of the conversion structure comprises production of:
- a buffer layer, produced on the basis of $In_{x3}Ga_{1-x3}N$ starting from the nucleation layer, configured to allow lattice adaptation between the $In_{x2}Ga_{1-x2}N$ of the nucleation layer and the $In_{x4}Ga_{1-x4}N$ of a barrier layer of the emission layer with which it is intended to be in contact.

10. Method according to claim 9, in which the buffer layer is formed of an alternation of layers based on GaN and of layers of $In_{x3'}Ga_{1-x3'}N$ with an atomic proportion of indium x3'.

11. Method according to claim 10, in which the layers of $In_{x3'}Ga_{1-x3'}N$ have an atomic proportion of indium x3' greater than or equal to the atomic proportion of indium x4.

12. Method according to claim 9, in which the buffer layer is made of $In_{x3}Ga_{1-x3}N$ with an atomic proportion of indium x3 that increases between the value x2 at the interface with the nucleation layer and the value x4 at the interface with the barrier layer of the emission layer in contact with the buffer layer.

13. Method according to claim 1, in which the growth structure is formed of a stack of a supporting layer, a binding layer and the nucleation layer.

14. Method according to claim 13, in which the nucleation layer is formed by transfer, onto the binding layer, of a layer of $In_{x2}Ga_{1-x2}N$ grown epitaxially beforehand starting from a growth substrate, followed by separation of the layer of $In_{x2}Ga_{1-x2}N$ into two parts at the level of a zone weakened following prior ion implantation, the part in contact with the binding layer forming the nucleation layer.

15. Method according to claim 13, comprising, following the transfer step iii, removal of the supporting layer and of the binding layer from the growth structure.

* * * * *

UNITED STATES PATENT AND TRADEMARK OFFICE
CERTIFICATE OF CORRECTION

PATENT NO. : 10,886,429 B2
APPLICATION NO. : 16/223806
DATED : January 5, 2021
INVENTOR(S) : Dussaigne et al.

Page 1 of 2

It is certified that error appears in the above-identified patent and that said Letters Patent is hereby corrected as shown below:

On the Title Page

Left column, Item (72), Line 2, delete "Cote" and insert therefor -- Côte --.

In the Claims

In Column 12, Claim 1, Line 5, delete "Method" and insert therefor -- A method --.

In Column 12, Claim 1, Line 7, delete "a emission" and insert therefor -- an emission --.

In Column 12, Claim 2, Line 26, delete "Method" and insert therefor -- The method --.

In Column 12, Claim 3, Line 32, delete "Method" and insert therefor -- The method --.

In Column 12, Claim 4, Line 41, delete "Method" and insert therefor -- The method --.

In Column 12, Claim 5, Line 47, delete "Method" and insert therefor -- The method --.

In Column 12, Claim 6, Line 54, delete "Method" and insert therefor -- The method --.

In Column 12, Claim 7, Line 56, delete "Method" and insert therefor -- The method --.

In Column 12, Claim 8, Line 59, delete "Method" and insert therefor -- The method --.

In Column 12, Claim 9, Line 64, delete "Method" and insert therefor -- The method --.

In Column 13, Claim 10, Line 11, delete "Method" and insert therefor -- The method --.

Signed and Sealed this
Tenth Day of February, 2026

John A. Squires
*Director of the United States Patent and Trademark Office*

CERTIFICATE OF CORRECTION (continued)
U.S. Pat. No. 10,886,429 B2

In Column 13, Claim 11, Line 15, delete "Method" and insert therefor -- The method --.

In Column 13, Claim 12, Line 18, delete "Method" and insert therefor -- The method --.

In Column 14, Claim 13, Line 5, delete "Method" and insert therefor -- The method --.

In Column 14, Claim 14, Line 8, delete "Method" and insert therefor -- The method --.

In Column 14, Claim 15, Line 15, delete "Method" and insert therefor -- The method --.